(12) United States Patent
Orbon et al.

(10) Patent No.: US 7,760,929 B2
(45) Date of Patent: Jul. 20, 2010

(54) GROUPING SYSTEMATIC DEFECTS WITH FEEDBACK FROM ELECTRICAL INSPECTION

(75) Inventors: Jacob J. Orbon, Morgan Hill, CA (US); Youval Nehmadi, Sunnyvale, CA (US); Ofer Bokobza, Cupertino, CA (US); Ariel Ben-Porath, Gealya (IL); Erez Ravid, Sunnyvale, CA (US); Rinat Shimshi, San Jose, CA (US); Vicky Svidenko, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 936 days.

(21) Appl. No.: 11/553,745

(22) Filed: Oct. 27, 2006

(65) Prior Publication Data

US 2007/0052963 A1 Mar. 8, 2007

Related U.S. Application Data

(63) Continuation-in-part of application No. 11/383,395, filed on May 15, 2006.

(60) Provisional application No. 60/740,408, filed on Nov. 28, 2005, provisional application No. 60/681,095, filed on May 13, 2005, provisional application No. 60/684,360, filed on May 24, 2005.

(51) Int. Cl.
*G06K 9/00* (2006.01)
(52) U.S. Cl. ...................... 382/148; 382/149
(58) Field of Classification Search ................. 382/148, 382/149
See application file for complete search history.

(56) References Cited

U.S. PATENT DOCUMENTS

2006/0171221 A1* 8/2006 Mollat et al. ................. 365/201
2007/0156379 A1* 7/2007 Kulkarni et al. ............... 703/14

* cited by examiner

*Primary Examiner*—Brian P Werner
(74) *Attorney, Agent, or Firm*—Patterson & Sheridan, LLP

(57) ABSTRACT

Methods and apparatus for categorizing defects on workpieces, such as semiconductor wafers and masks used in lithographically writing patterns into such wafers are provided. For some embodiments, by analyzing the layout in the neighborhood of the defect, and matching it to similar defected neighborhoods in different locations across the die, defects may be categorized by common structures in which they occur.

10 Claims, 19 Drawing Sheets

800

```
┌─────────────────────────────────────────────┐
│              GU1 - SETUP                    │
├─────────────────────────────────────────────┤
│  ┌─ STRUCTURE ALIGNMENT ──────────────────┐ │
│  │  CLIP SHAPE          [SQUARE ▽]— 812  │ │
│  │                                        │ │
│  │  CLIP SIZE           [  10 µ ]— 814   │ │
│  │                                        │ │
│  │  ALIGNMENT TOLERANCE [   5 µ ]— 816   │ │
│  └────────────────────────────────────────┘ │
│                                             │
│  ┌─ SAMPLING ─────────────────────────────┐ │
│  │  MAX SAMPLES         [  500  ]— 822   │ │
│  │                                        │ │
│  └────────────────────────────────────────┘ │
└─────────────────────────────────────────────┘
```

FIG. 8

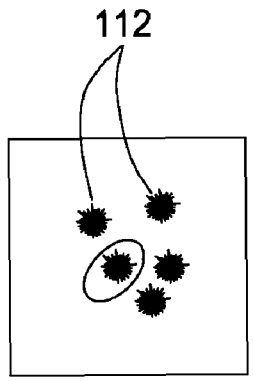 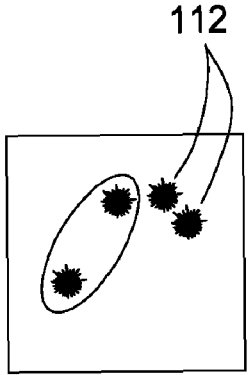 INSPECTED
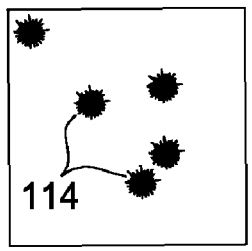 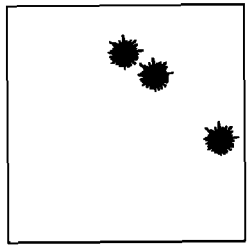 HOT - SPOTS PR.
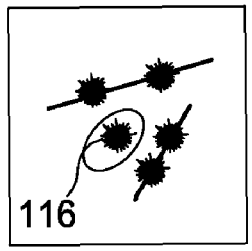 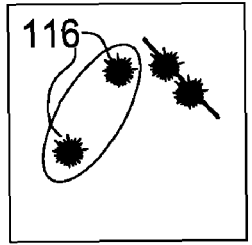 SAMPLE SET 1 (DETECTED, NOT PREDICTED)
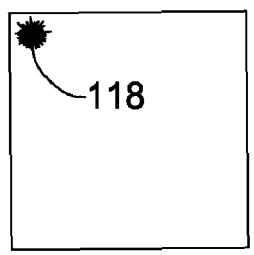 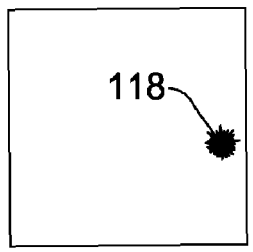 SAMPLE SET 2 (PREDICTED, NOT DETECTED)
FIG. 11

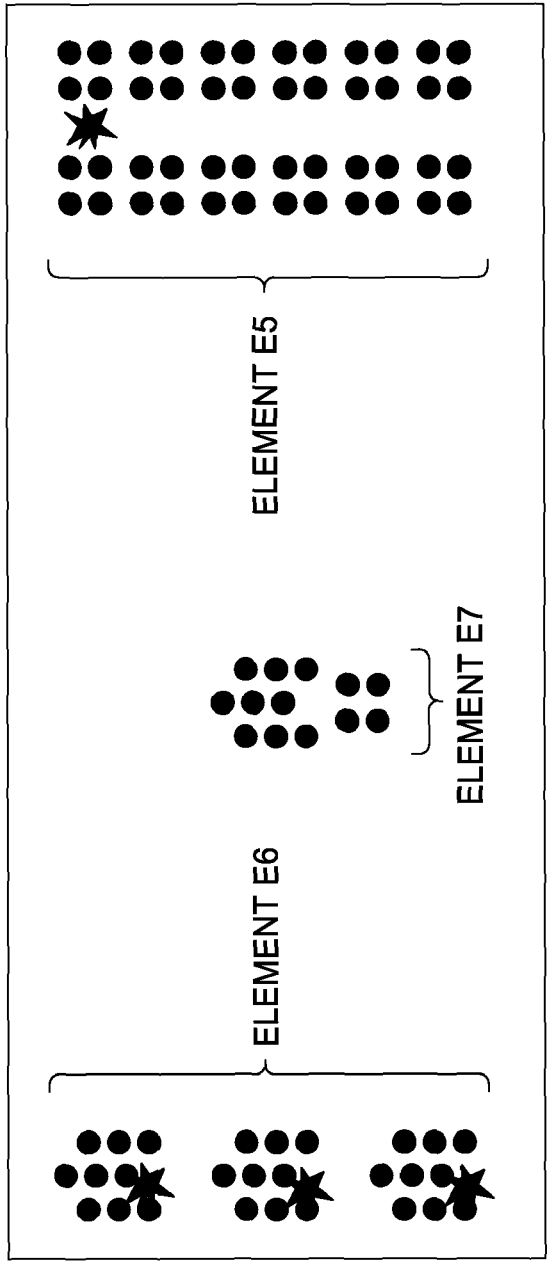

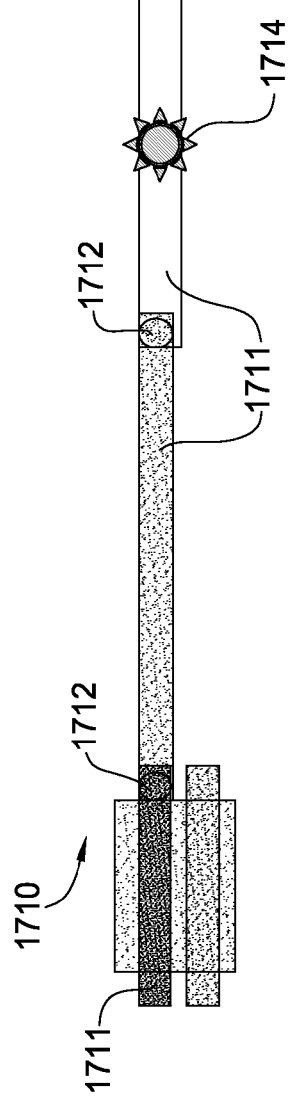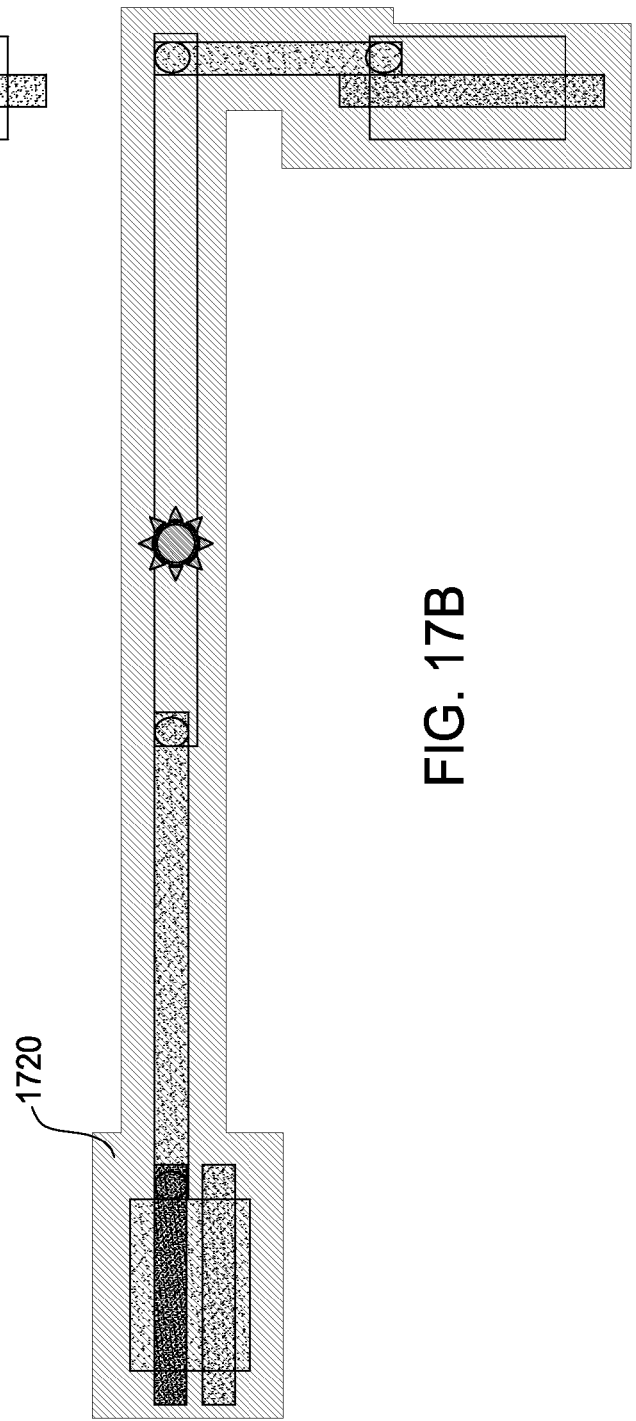

| | VISIBLE | NON VISIBLE |
|---|---|---|
| SYSTEMATIC | PROCESS INTEGRATION FIX | <u>API</u> <u>EBI</u> |
| RANDOM | DEFECT REDUCTION | HIGH MAG <u>OPTICAL</u> <u>EBI</u> |

ATTRIBUTES
- M1 CMP "Z" HEIGHT
- MINIMUM PITCH POLY (DRC)
- CONTACT TO POLY SPACE (DFY)
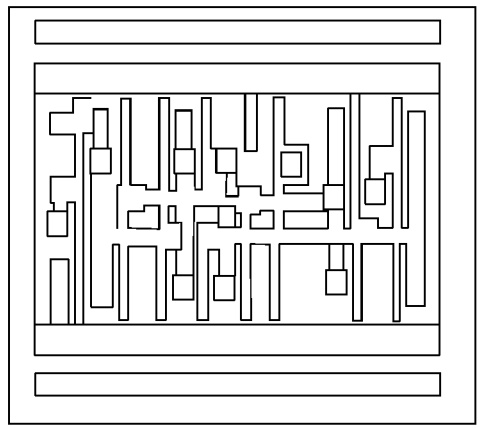
CELL BASED WINDOW
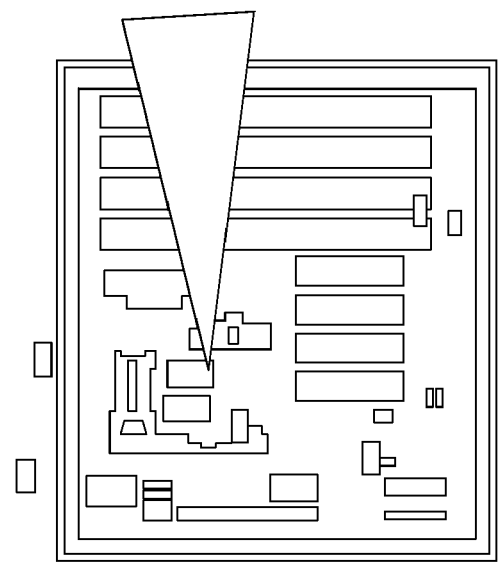
| WINDOW | STRUCTURAL TEST | CRITICAL AREA | DEFECTS | CMP "Z" (sigma) | STACKED VIA | WIDE METAL |
|---|---|---|---|---|---|---|
| 1 | 0.3 | 0.3 | 0 | 0 | 0 | 0.03 |
| 2 | 0.3 | 0.2 | 0 | 1 | 0 | 0.02 |
| 3 | 0.2 | 0.4 | 2 | -3 | 0 | 0 |
| 4 | 0.9 | 0.3 | 0 | 1 | 2 | 0.02 |
FIG. 19

GROUPING SYSTEMATIC DEFECTS WITH FEEDBACK FROM ELECTRICAL INSPECTION

CROSS-REFERENCE TO RELATED APPLICATIONS

The present invention is a continuation-in-part of U.S. patent application Ser. No. 11/383,395 filed May 15, 2006, which claims benefit of U.S. provisional application Nos. 60/740,408, filed Nov. 28, 2005, 60/681,095, filed May 13, 2005, and 60/684,360, filed May 24, 2005, all of which are herein incorporated by reference in their entirety.

BACKGROUND OF THE INVENTION

1. Field of the Invention

Embodiments of the present invention generally relate to detecting defects in semiconductor products and, more particularly, to classifying and grouping systematic and random defects.

2. Description of the Related Art

Semiconductor devices, such as integrated circuits, are typically designed based on repetitive structures such as individual logic cells or larger blocks that perform a specific electrical function. In some cases, these repetitive structures may exhibit specific failure modes due to an interaction of the layout with a specific process module used in the manufacturing flow.

In some cases, there may be systematic defects in structures that arise from a variety of causes. These causes may include imperfections in the deposition, patterning or removal of a specific material or structure. Defects may also be caused by shifting process parameters, such as deposition, lithographic, etch or other parameters.

Some defects also arise due to design-process interactions (DPI defects). In other words, DPI defects arise due to the sensitivity of particular designs to process variations, such as variations in deposition, lithographic, etch, or other parameters. Defects resulting from proximity effects, caused by influence of neighboring or nearby structures, may also increase with some process recipes due to sensitivity of certain patterned structures to changing process recipes.

As technology nodes advance, manufacturing processes are called upon to produce structures having smaller and smaller dimensions. Unless measures are taken to reduce variations in manufacturing processes the number of defects will typically increase in inverse proportion to feature size. Another approach, referred to as design for manufacturability (DFM), is to generate designs that are less sensitive to anticipated process variations, thereby reducing the number DPI defects and improving product yield.

Inspection tools are often utilized during mass production, where efforts are focused on random defects and process monitoring, in an effort to assure that the process does not drift. One example of such an inspection tool is the UVision Inspection system, available from Applied Materials of Santa Clara, Calif., which utilizes multi-beam deep ultra-violet (DUV) laser illumination and highly sensitive photo-detectors to generate high fidelity 3D images allowing a wide variety of defects to be detected. Such inspection tools typically generate defect maps identifying possibly tens of thousands to hundreds of thousands of defects at various locations in a semiconductor wafer.

Unfortunately, the sheer volume of these defects makes it challenging to extract meaningful data regarding DPI defects. The individual defects typically identify locations where a critical dimension (CD) has deviated beyond an acceptable tolerance (possibly leading to electrical shorts, voids or breaks). As such, substantial and time consuming analysis and parsing of the individual defects would be required in order to identify design-process interaction and identify required changes in design or process. Further, many of the defects are repetitive due to the repetitive nature of the majority of device layouts. In other words, similar defect mechanisms will typically trigger multiple defects on various locations across the die. However, manually inspecting defect maps and design layout in an effort to correlate these repetitive defects into their unique defect mechanisms is time and cost prohibitive.

In some cases, simulations (e.g., optical proximity correction-OPC modeling, Chemical Mechanical Polishing) may be performed to identify failure-potential locations ("hotspots") across the die, for example, in an effort to focus defect inspection on a limited number of locations and, therefore, reduce the time and cost for meaningful analysis. Unfortunately, not all of these identified hot-spots actually result in defects. Conversely, not all of the actual defects are predicted by the modeling simulation.

Semiconductor devices are typically tested electrically at the end of the manufacturing process. These electrical tests produce a list of electrical defects. Since these electrical defects correspond to a set of repetitive structures, electrical test can be used to determine if the defects detected in the inspection created an electrical fault. Unfortunately, not all of these identified defects actually result in faults. Conversely, not all of the faults are detected by the inspections.

Accordingly, there is a need for improved techniques for grouping and identifying systematic defects in semiconductor wafers, as well as masks used in lithographic writing of patterns.

SUMMARY OF THE INVENTION

The present invention generally provides methods and systems for categorizing defects in fabrication of a semiconductor wafer.

One embodiment provides a computer-implemented method for categorizing defects in fabrication of a semiconductor wafer. The method generally includes determining locations of defects on the semiconductor wafer, determining if a set of defect areas, each surrounding a different one of the defects, each contain one or more common structural elements, and if so, categorizing the defects surrounded by the set of defect areas, as corresponding to the common structural elements.

Another embodiment provides another computer-implemented method for categorizing defects in fabrication of a semiconductor wafer. The method generally includes generating a set of defect clips, each surrounding a different one of the defects and containing one or more structural elements. The method further includes, for each clip, determining if the structural elements in that clip match the structural elements in another clip and, if so categorizing that clip and the other clip as corresponding to the matching structural elements. The method further includes providing an indication of the quantity of defects, for at least some portion of the wafer, categorized as belonging different structural elements.

Another embodiment provides a system generally including an inspection system configured to inspect the wafer and generate a defect map indicating locations of defects on the wafer, an electrical testing system and a defect processing component. The defect processing component is generally configured to, determine locations of defects on the semiconductor wafer based on the defect map, determine if a set of defect areas, each surrounding a different one of the defects, each contain one or more common structural elements and, if so, categorize the defects surrounded by the set of defect areas, as corresponding to the common structural elements.

Another embodiment provides computer-readable medium containing executable instructions which, when executed by a processor, perform operations for categorizing defects in fabrication of a semiconductor wafer. The operations generally include determining locations of defects on the semiconductor wafer, determining if a set of defect areas, each surrounding a different one of the defects, each contain one or more common structural elements, and if so, categorizing the defects surrounded by the set of defect areas, as corresponding to the common structural elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 illustrates an exemplary graphical user interface (GUI) for configuring parameters affecting defect binning in accordance with embodiments of the present invention.

FIG. 11 illustrates a sample set of defect locations detected by inspection, but not predicted by simulation, in accordance with embodiments of the present invention.

FIGS. 12A and 12B illustrate hierarchical design structures and defects located thereon.

FIGS. 13A-C illustrate exemplary hierarchical structure defect analysis in accordance with embodiments of the present invention.

FIGS. 17A and 17B illustrate how a net inspected via structural testing may be mapped to a physical location for analysis.

FIG. 19 illustrates how exemplary process attributes may impact defects.

DETAILED DESCRIPTION

Embodiments of the present invention generally provide methods and apparatus for detecting defects on workpieces, such as semiconductor wafers and masks used in lithographically writing patterns into such wafers. For some embodiments, by analyzing the layout in the neighborhood of the defect, and matching it to similar defected neighborhoods in different locations across the die, defects may be categorized by common structures in which they occur. This automated categorization allows critical structures to be identified for further investigation into the relationship of design features and/or process parameters (design process interaction) that cause the corresponding defects.

For some embodiments, software simulations (e.g., OPC modeling or Chemical Mechanical Planarization) may be performed to generate a list of failure-potential locations (hot-spots) across a die. Inspection of actual detected defects may indicate that not all of the predicted failure locations result in actual defects and, further, that not all of the actual detected defects are predicted by the simulation. Either case indicates design-process interaction that is not taken into consideration by the simulation software. As a result, any defect identified by only one of the methods (via simulation or inspection) may be categorized appropriately for further analysis.

Those skilled in the art will recognize that concepts described herein may be used in conjunction with existing inspection tools and may be applied to advantage in a variety of manners. During an initial "process integration" stage of a semiconductor product design, concepts described herein may be used as part of a qualification process. For example, information extracted from automated defect review may be used to improve design and/or process parameters, in an effort to improve production yield. In a later (ramp up or mass production) stage, the same or similar concepts may be applied as part of a sustained effort to monitor design process interaction and maintain or enhance production yield.

Those skilled in the art will also recognize that the operations described herein may be performed by software, for example, executing on any suitable computing device, by hardware, or any suitable combination of hardware and software. Accordingly, one or more embodiments of the present invention may include a tangible storage medium containing instructions for performing the operations described herein. For some embodiments, the operations described herein may be performed by hardware and/or software integrated with what may be an otherwise conventional inspection tool.

An Exemplary Process Flow

Figure 1:
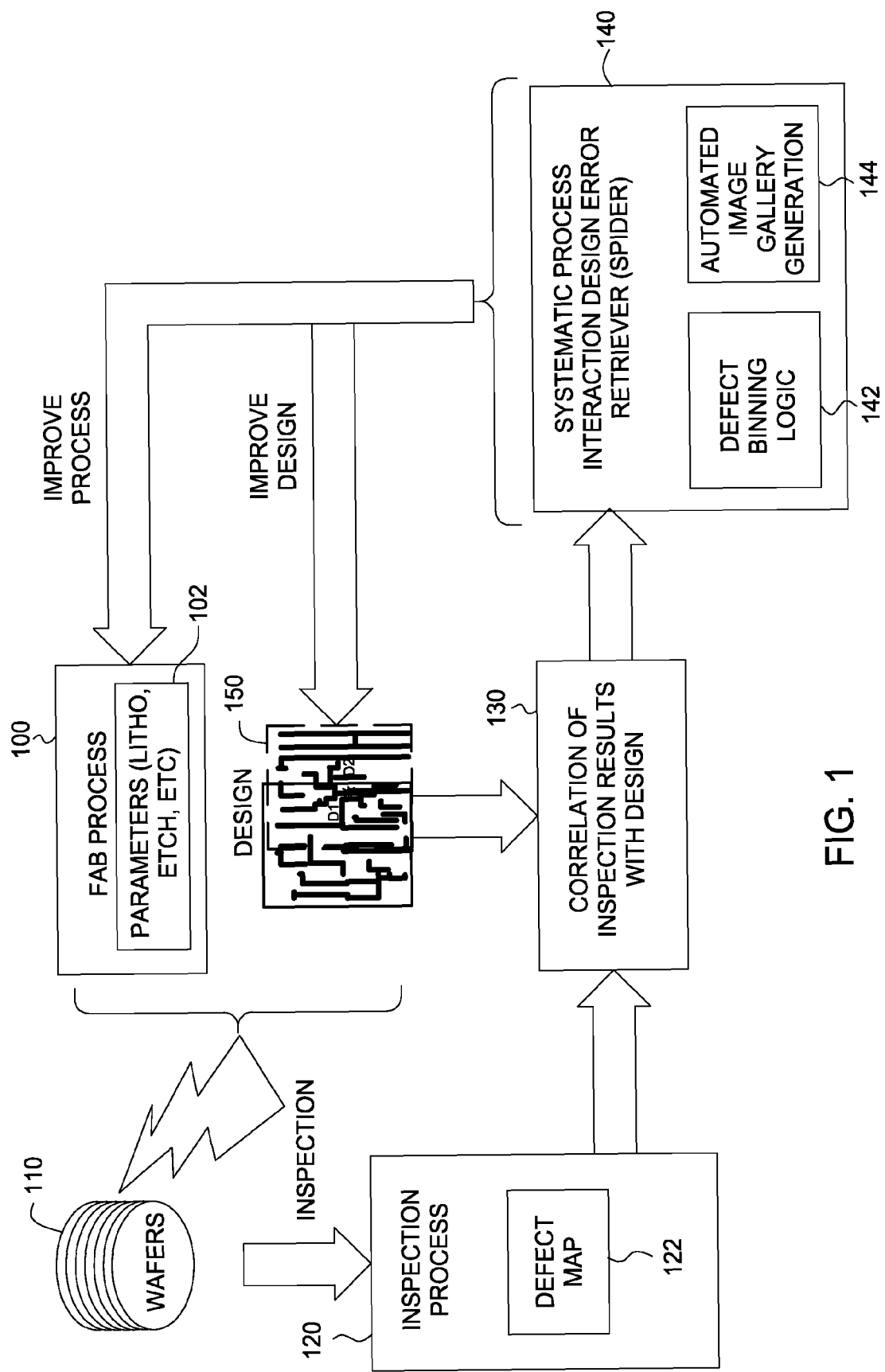
FIG. 1 illustrates an exemplary workflow for a semiconductor design, fabrication and inspection in accordance with embodiments of the present invention.

FIG. 1 illustrates an exemplary workflow for semiconductor design and fabrication, in accordance with embodiments of the present invention. As illustrated, wafers 110 may be produced in accordance with a design 150, via a fabrication process 100 controlled by a set of process parameters 102. These process parameters may include a wide variety of parameters, for example, lithography parameters (e.g., focus and exposure "recipes"), etch parameters, and any other type parameters. The wafers may be generated by any suitable type lithography system, for example, utilizing one or more masks to form desired structures therein or via a "maskless" raster-based printing.

Due to a variety of factors, the structures formed (e.g., in separate dice) in the wafers 110 will not exactly match the design 150. To determine how the actual wafers 110 vary from design, one or more of the wafers 110 will undergo an inspection process 120. The inspection process 120 may be performed using any suitable type inspection system, such as the SEMVision and UVision inspection systems available from Applied Materials. While shown as a separate process, the inspection process 120 may, in some cases be performed in conjunction ("inline") with the fabrication process 100.

As part of the inspection process, a defect map 132 identifying locations of defects in the wafers 110 may be generated. The defects indicated in the map 132 may be, for example, locations of elements (e.g., lines, holes/vias) formed in the wafers 110 where critical dimensions (CD) are outside a specified range. As illustrated, inspection results (e.g., captured in the defect map) may be correlated with the design via a correlation process 130, for example, aligning the defect map to a computer automated design (CAD) model of the design 150, for example, in a graphics form (such as GDS, GDS-II, and the like). As a result, defects from the map 132 may be effectively located with the elements on which they occur.

In some cases, structures may be printed into the wafers 110 while modulating focus and/or exposure or any other process variable, in an effort to determine the sensitivity of the design 150 to variations in process parameters. A suitable process window for the design may then be chosen, for example, by comparing the detected defects with the process variable. A suitable process window may be chosen as a range of the chosen process variables that results in acceptable levels of detected defects or electrical faults.

As illustrated, embodiments of the present invention may provide an automated systematic process interaction design error retriever (SPIDER) process 140. As will be described in greater detail below, the automated defect review process 140 may process a relatively large amount of defect data in an effort to extract information that may be used to gain insight into design process interaction (DPI). For some embodiments, defect binning logic 142 may parse the defects identified in the defect map, which may identify tens of thousands to hundreds of thousands of defects, to identify a subset of defects that warrant further investigation.

For some embodiments, a gallery of images may be automatically generated based on automated defect review, for example, by capturing images (e.g., with a scanning electron microscope-SEM) of the same defect location on multiple dice. In some cases, the gallery may contain images from common locations of multiple dice printed according to different focus and exposure settings, thereby allowing insight into process window sensitivity. Automatically generating an image gallery may facilitate examination of multiple dice to see if a defect is systematic, which may save substantial time when trying to find a root cause of a defect.

Information about design process interaction extracted from the defect inspection process, via automated defect review, may be used to enhance production yield. For example, in some cases, automated defect review may identify critical design structures (with a high number of corresponding defects) that may be modified to improve design. As an alternative, or in addition, the fabrication process may be improved, for example, by adjusting lithography or other (e.g., etch) process parameters based on information that a critical structure exhibits increased defects for certain process recipes.

Design Based Binning

Figure 2:
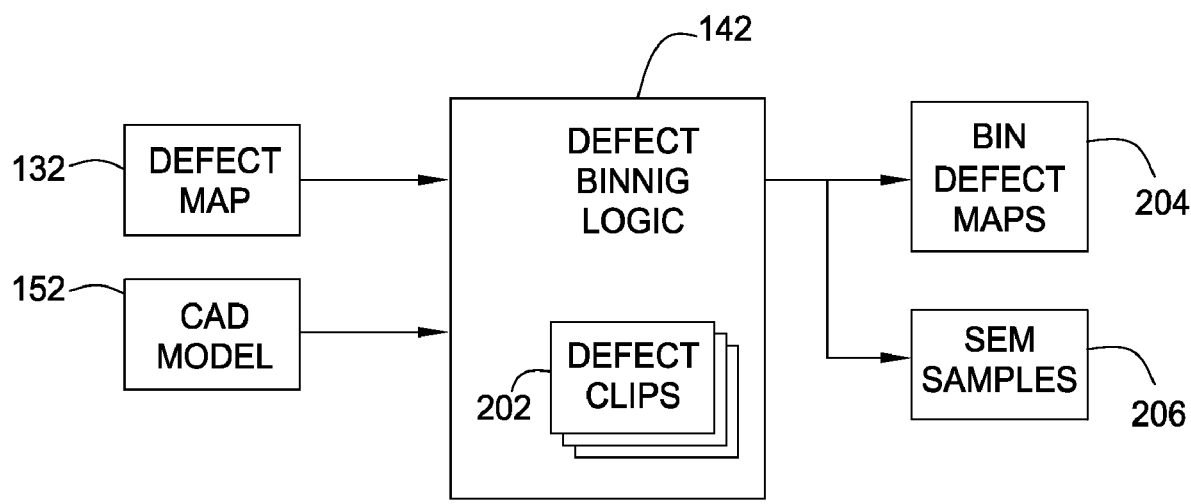
FIG. 2 illustrates an exemplary defect processing mechanism for defect binning in accordance with embodiments of the present invention.

For some embodiments, rather than focus on critical dimension (CD) analysis only, defect field of view may be "widened" to target structural elements by including areas surrounding defects, in an effort to capture information regarding proximity effects. FIG. 2 illustrates logically how defect binning logic 142 may be configured to categorize defects into structural "bins," by examining areas surrounding defects.

Figure 3:
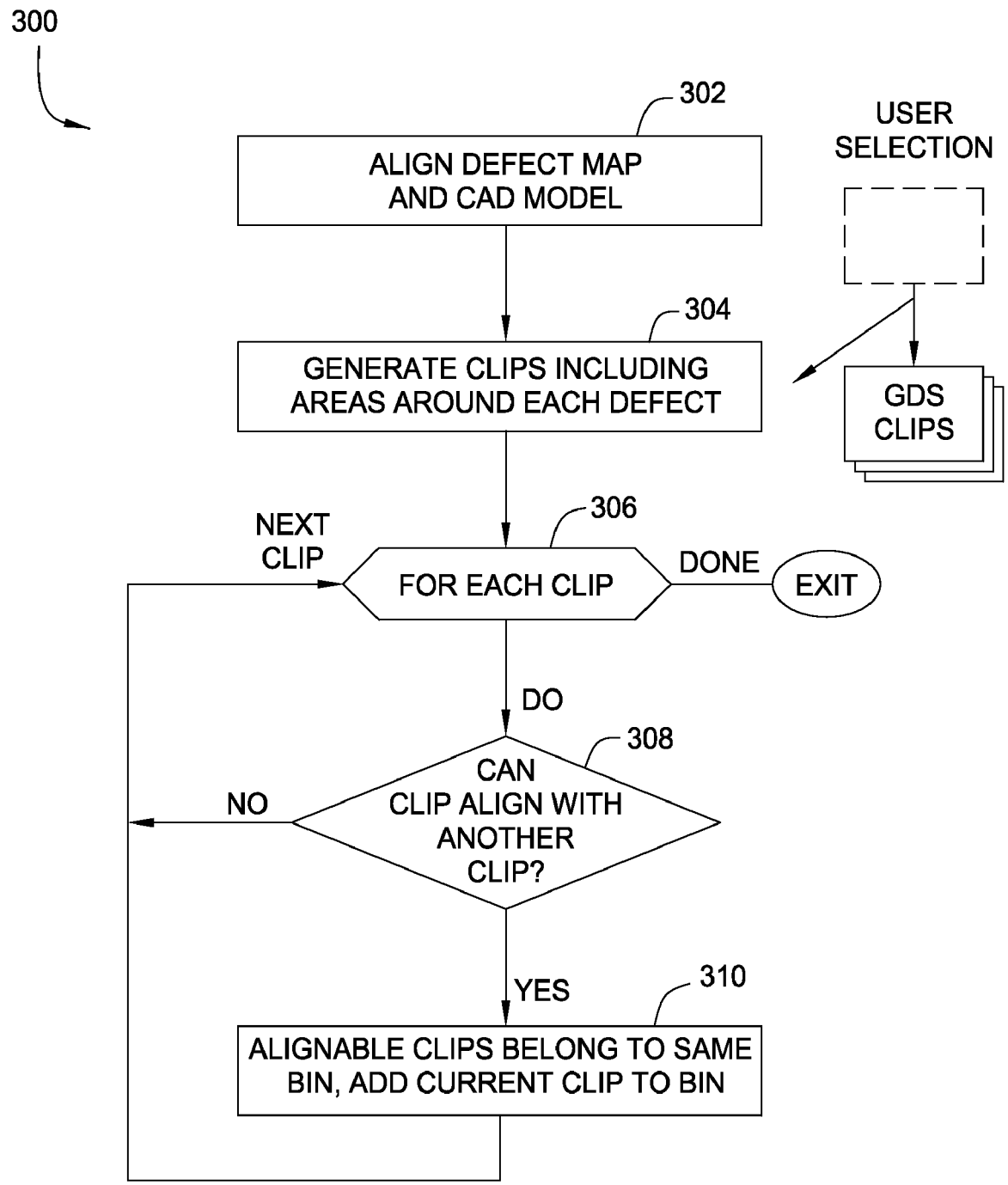
FIG. 3 is a flow diagram of exemplary operations for design-based defect binning in accordance with embodiments of the present invention.

FIG. 3 is a flow diagram of exemplary operations for design-based defect binning, for example, that may be performed by the defect binning logic 142. Therefore, to facilitate understanding the defect binning logic 142 may be described with simultaneous reference to both FIGS. 2 and 3. Those skilled in the art will recognize that binning logic 142 may be implemented, for example, as a software program running on any suitable computing device (e.g., a conventional personal computer, specialized personal computer, programmable logic controller), and/or as dedicated hardware. Further, the operations 300 are exemplary only, and any suitable operations to identify defects corresponding to common structural elements may also be utilized.

The operations 300 begin, at step 302, by aligning the defect map 132 and CAD model 152. As previously described, this allows defects to be correlated to their position relative to a structure in the design 150. As previously described, due to the repetitive nature of typical device layouts, a systematic defect mechanism will typically trigger multiple defects on various locations across a die (as well as across common location on multiple dice on a wafer). By analyzing the design layout in the area surrounding the defect (the defect neighborhood), and matching it to similar defected neighborhoods in different locations across the die/wafer, defects corresponding to even relatively complex structures may be automatically identified.

To this end, at step 304, area "clips" are generated including areas surrounding each defect. As an example, each clip may be a rectangle of a predetermined size centered on the defect. For some embodiments, the clips may be generated from an image file of the design model, such as a GDS file. At step 306, a loop of operations 308-310 is performed on each clip to identify matching structural elements. At step 308, a determination is made as to whether a current clip can be aligned with another clip. If two clips can be aligned, they are added to the same structural defect bin, at step 310.

Figure 4:
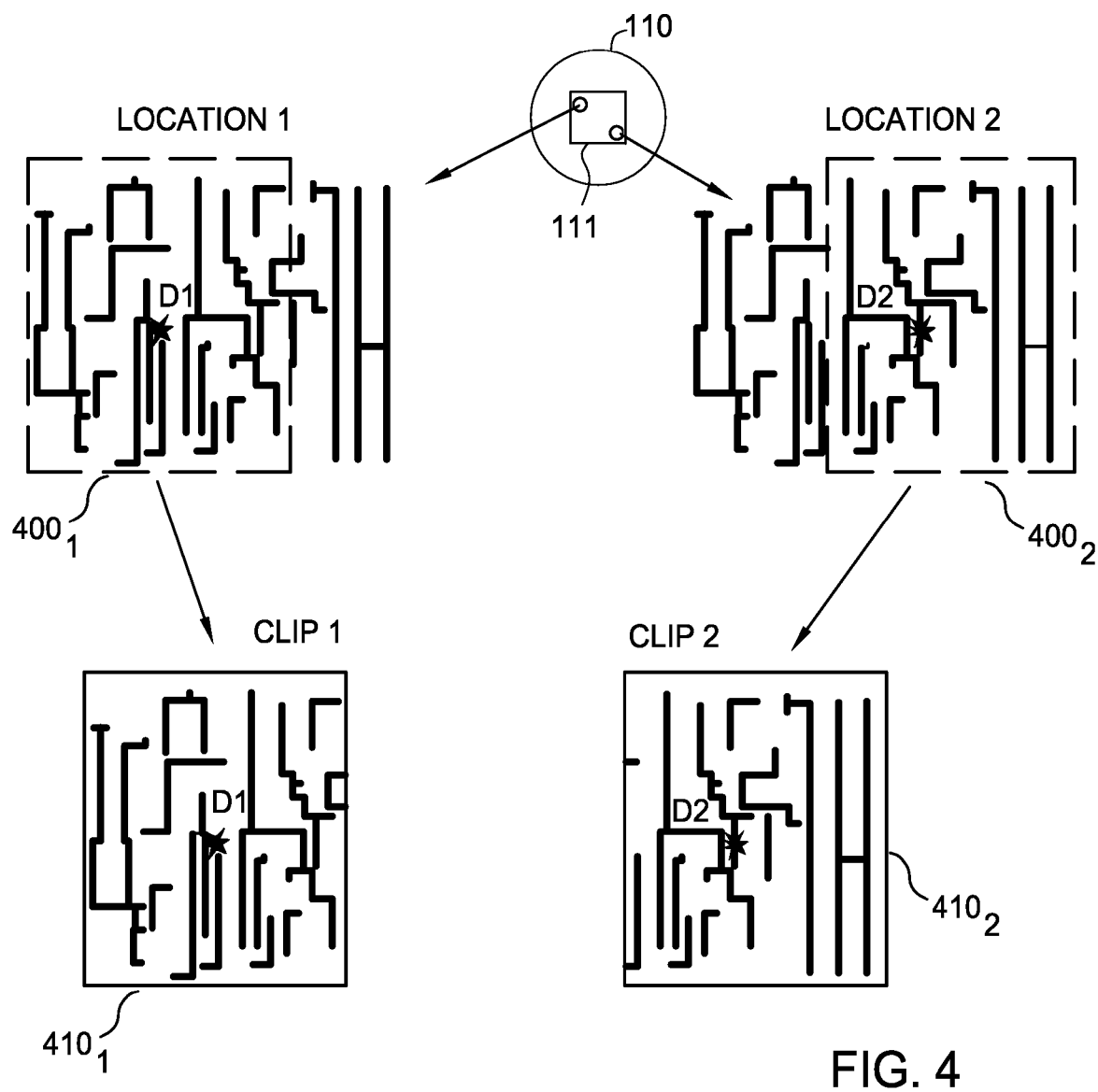
FIG. 4 illustrates an exemplary technique for generating a clip of an area surrounding a defect in accordance with embodiments of the present invention.
Figure 5:
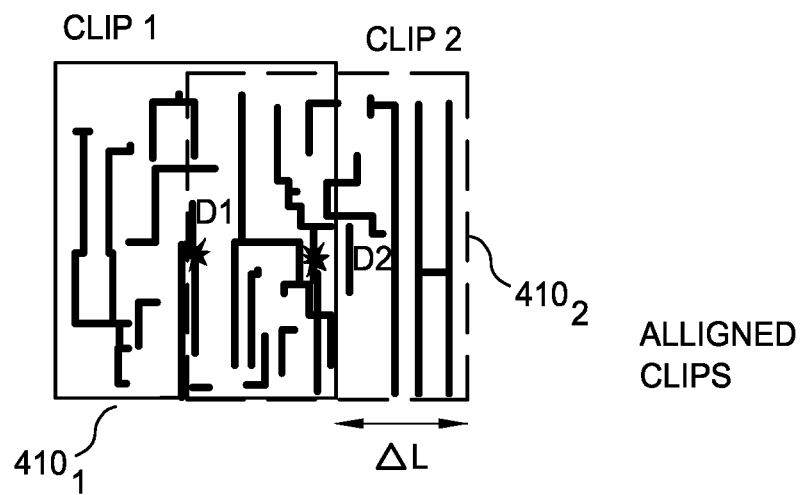
FIG. 5 illustrates alignment of clips for defects belonging to a common defect bin in accordance with embodiments of the present invention.

The generation and alignment of defect clips is illustrated in FIGS. 4 and 5, respectively. As illustrated in FIG. 4, two defects D1 and D2 may be detected in separate locations ($400_1$ and $400_2$) of a wafer die 111. For some embodiments, clips from locations on separate dice or even separate wafers may also be examined for alignment. In any case, separate clips ($400_1$ and $400_2$) may be generated by taking an area surrounding the defects. For some embodiments, the clip area may be defined by a predetermined boundary, such as a square of a given side length (L) centered on the defect.

From examination of the defect locations, it can be seen that each location has common structure elements, albeit the defects D1 and D2, are located in different relative positions within the common structure elements. As illustrated in FIG. 5, these two exemplary clips may be aligned, within a distance (shown as ΔL). For some embodiments, alignment may be determined if the clips can be aligned, with "registration" of common structural elements, within a predetermined distance. As an example, assuming an exemplary square clip shape having a length (L) of 10 microns, alignment may be confirmed as long as clips may be registered within a distance of 5 microns (i.e., ΔL=5 microns).

For some embodiments, the size and shape of the clip area, as well as the allowable (mis)registration distance (ΔL) may be adjustable, e.g., via a graphical user interface (GUI). Further, any suitable algorithm may be utilized to check for a match in alignment, for example, using any suitable type of graphics processing algorithms to manipulate GDS clips, or image processing algorithms to manipulate image clips. As used herein, alignment generally refers to the ability to match similar structural features of graphics and/or image clips. Because circuit elements are often rotated (e.g., 90, 180, or 270 degrees) and/or mirrored about an axis, alignment algorithms may manipulate clips to allow alignment of clips that are rotated and/or mirrored relative to each other.

By categorizing defects into structural bins, it is thus possible to track the number of defects associated with each corresponding structure, which may provide valuable information regarding design process interaction. This information may help to identify "critical" structures having a relatively high number of corresponding defects.

Figure 6A:
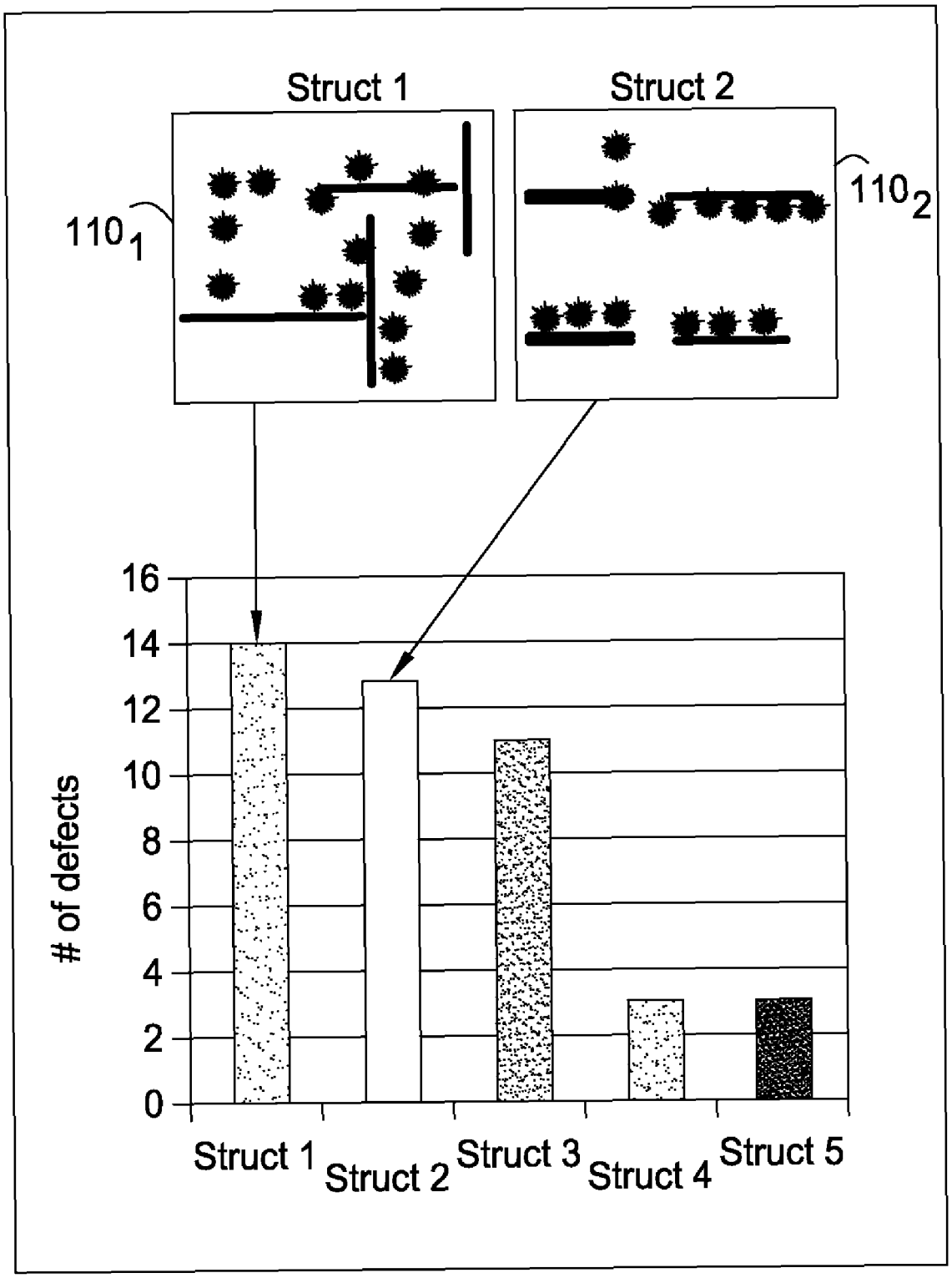
FIGS. 6A and 6B illustrate graphs depicting the number of defects in a plurality of defect bins in accordance with embodiments of the present invention.
Figure 6B:
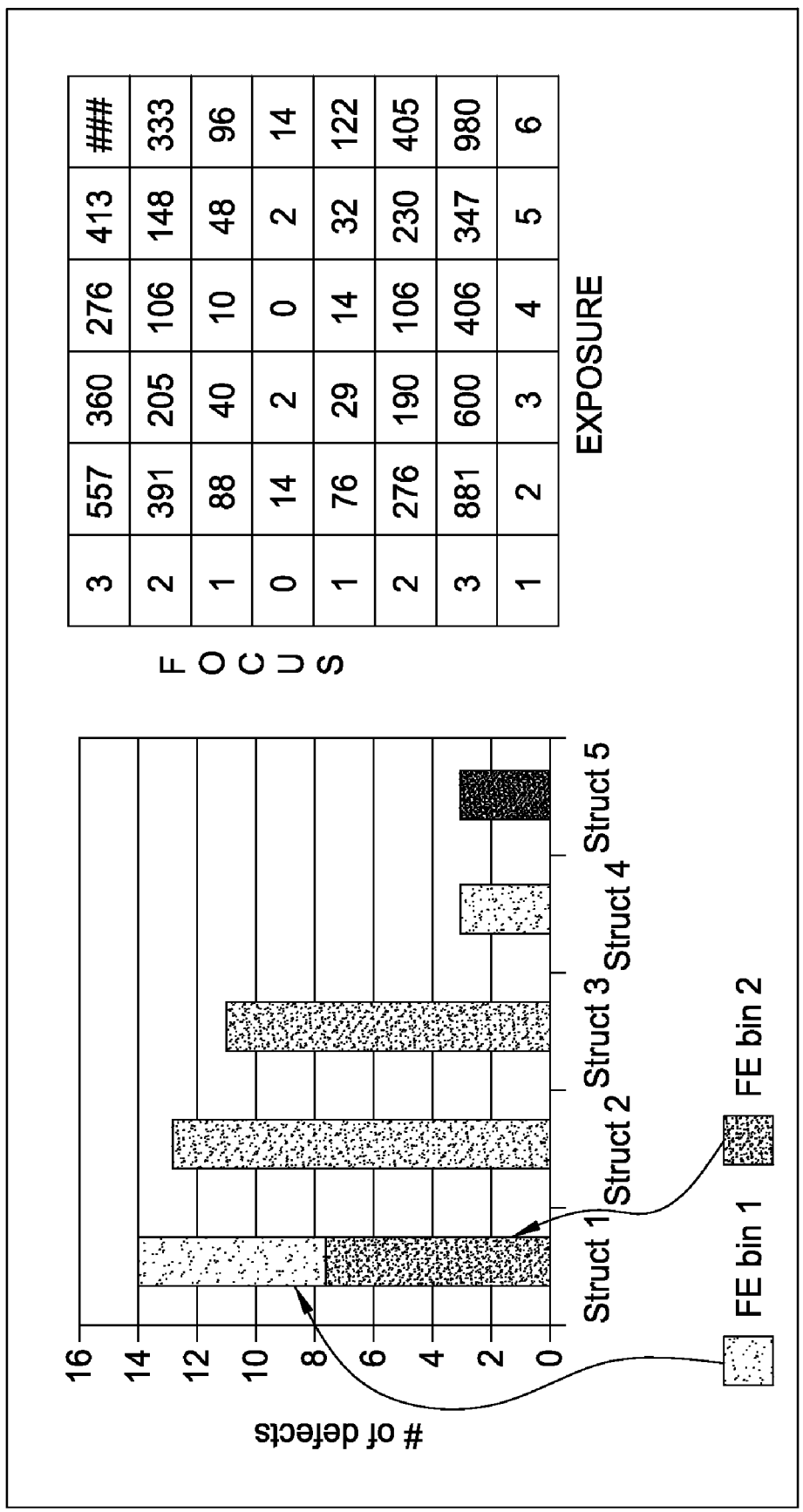

FIGS. 6A and 6B illustrate graphs depicting the number of defects in a plurality of defect bins in accordance with embodiments of the present invention. As illustrated, for the current area, only two relatively simple structures (Structures 1 and 2) $710_1$ and $710_2$ are illustrated to facilitate understanding. Referring first to FIG. 6A, fourteen defects corresponding to a Structure 1 are shown, while thirteen for Structure 2 are shown. For some embodiments, a user may be able to view structure defect bins for a particular user-specified die area, an entire die, multiple dice, an entire wafer or multiple wafers. A user may also be able to view the relative location of particular defects within a particular structure in a "stacked" manner (as shown in FIG. 6A). In other words, the relative position of defects from multiple locations may be displayed simultaneously, as if aligned portions of the locations containing the defects were stacked on top of each other.

Referring to FIG. 6B, defects in a particular structure bin may also correspond to particular process parameters used to write the structure. For example, as shown, eight of the defects in the bin for the Structure 1 correspond to a first focus and exposure level combination (or recipe) while the remaining six correspond to a second focus and exposure level combination. As previously described, the impact of focus and exposure on defects for a particular structure is useful information in selecting a process window and/or determining if a structure should be redesigned to accommodate a given process window.

Figure 7:
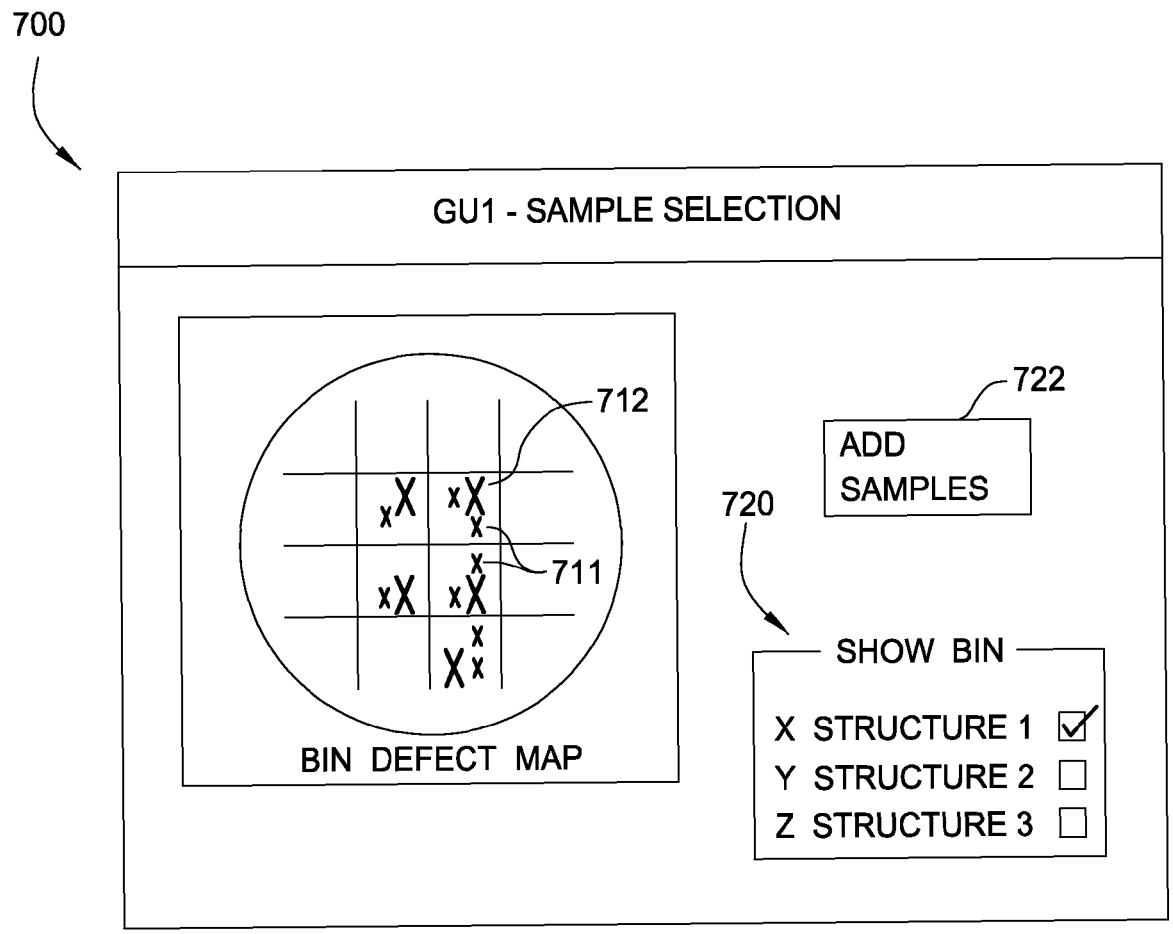
FIG. 7 illustrates an exemplary graphical user interface (GUI) for selecting sample defects in accordance with embodiments of the present invention.

FIG. 7 illustrates an exemplary graphical user interface 700 displaying a bin defect map 710 for an entire wafer in accordance with embodiments of the present invention. The bin defect map 710 may provide a global view of all defects 711 of a particular bin. For some embodiments defects from multiple bins may be displayed, for example, by specifying different structures via a selection box 720. Any suitable technique may be used to distinguish between different structures, such as different colors or different symbols (e.g., X, Y and Z).

The GUI 700 may also provide a simple manner for a user to specify a limited number of samples to be identified for further inspection, for example, via a scanning electron microscope. For example, a user may be able to select (e.g., with a mouse click) one or more defects 712 (each denoted with a larger X) from different locations (e.g., across multiple dice) and add the selected samples to a list via a button 722. As an alternative, a user may be able to specify various location and the locations may be automatically selected (e.g., under program control). As yet another alternative, a set of samples from various locations may be randomly selected (e.g., under program control). In either case, images around the defects selected for sampling may be taken (e.g., via SEM), allowing further (e.g., manual) inspection of defective structures. Narrowing the number of samples to a relatively small portion (e.g., under 500) for sampling may greatly speed sampling time and still allow a good representation of defective structures "coverage."

For some embodiments, a number of the functions described herein may be configured by a user, for example, via a GUI setup screen. As an example, FIG. 8 illustrates an exemplary GUI 800 that allows a user to specify various parameters relating to the previously described structure alignment. As illustrated, a user may specify a defect clip shape 812, size 814 and alignment tolerance 816 (e.g., (ΔL). For some embodiments, a user may also specify one or more sampling criteria, such as the maximum number of samples 822 to select when automatic sampling of defects is performed. For some embodiments, users may be able to specify one or more particular type of structures, for which defects should be bin, possibly by selecting model images.

Automatic Image Gallery Generation

As previously described, for some embodiments, different dice may be printed with different focus and exposure combinations (e.g., creating an FEM wafer). For such embodiments, upon detection of defect in a given location of a first die, images of similar locations on other dice (written with different focus-exposure levels) may be automatically taken. Thus, a gallery of images of the same logic area on different dice printed with different focus-exposure levels may be automatically generated, which may greatly facilitate manual inspection to determine structure sensitivity to changing process windows.

Figure 9:
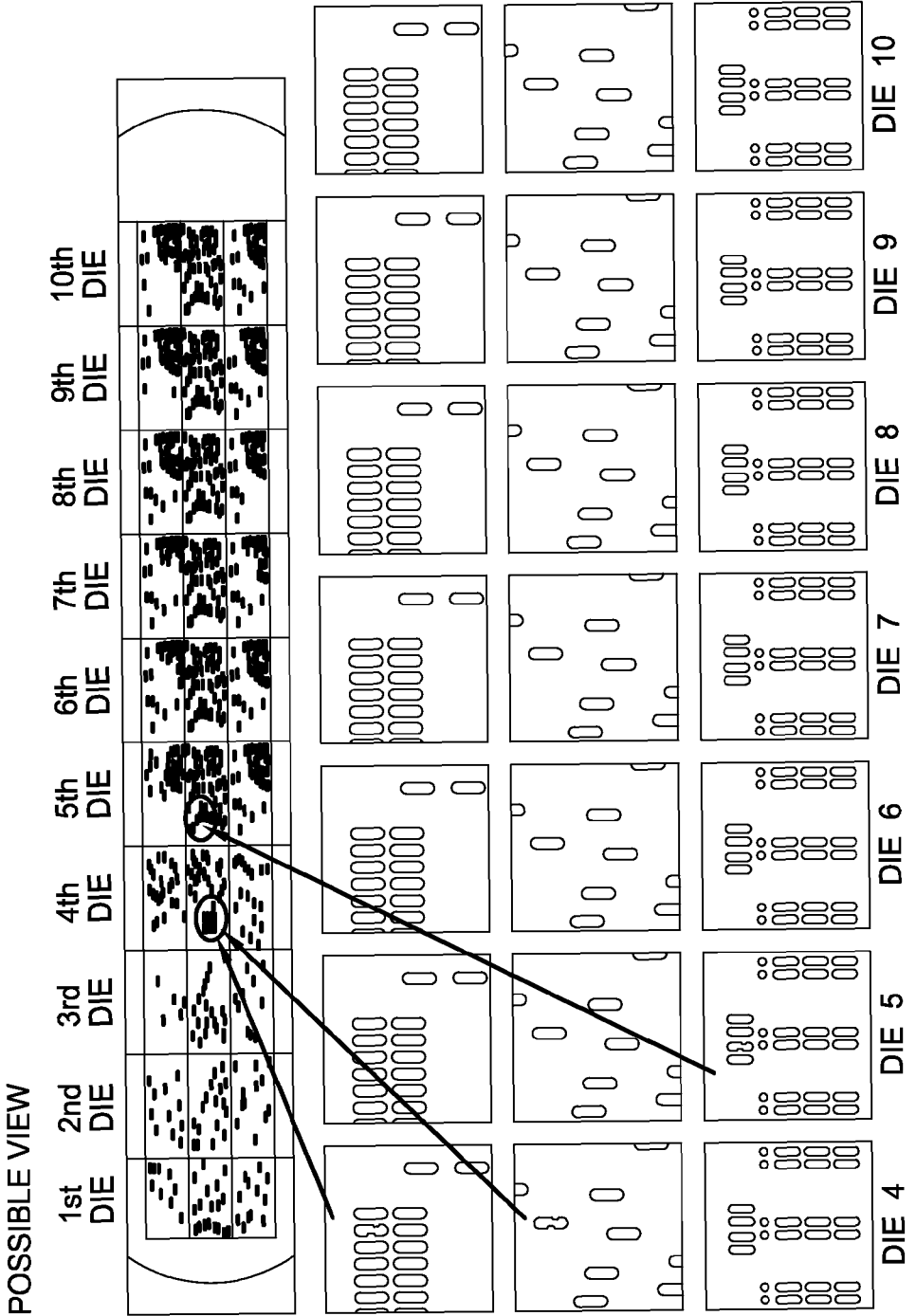
FIG. 9 illustrates an automatically generated image gallery for potential defect locations on multiple die.

FIG. 9 illustrates an exemplary image gallery for different logical areas (from three different fields of view) for a number of dice (DIE 4-DIE10), each having a different focus/exposure combination. For some embodiments, an image gallery may be generated in a similar manner even if focus and exposure levels are not varied, in order to provide a simple interface for determining if a particular defect exists on multiple dice.

For some embodiments, a defect location of interest may be selected (either automatically via ADR or specified by a user) and a gallery of images collected of the defect location at different focus/exposure levels may be automatically generated by SEM. In this manner, a comprehensive system with an inspection tool and defect analysis logic may be able to automatically trigger image capture via SEM. Such automation may be useful to present an end user with a gallery of images at different focus/exposure combinations much quicker than if the user had to manually generate the same images at the defect location of interest. By inspecting the gallery of images, the end user may be able to quickly gain insight into the relations between F/E and the defect, which may lead to elimination of marginal F/E combinations (e.g., at the edge of the process window) and ultimately better designs and/or processes with increased yield.

Model Based Binning

As previously described, for some embodiments, software simulation (such as OPC modeling) may be performed to generate a list of failure-potential locations or hot-spots across a die. While these predicted hot spots are useful and may help guide design efforts to reduce the number of defects, variations between predicted and actual inspected defects may also be useful.

On one hand, not all of the predicted locations will exhibit defects when inspected. Thus, there may actually be constructive design-process interaction (DPI) that is not taken into consideration by the simulation model. On the other hand, not all of the inspected defects will have been predicted. This may indicate destructive design-process interaction (DPI) not taken into consideration by the simulation model. To better understand DPI and improve yield, it may be useful to identify both types of locations (those having unpredicted defects and those for which defects were predicted, but not detected).

Figure 10:
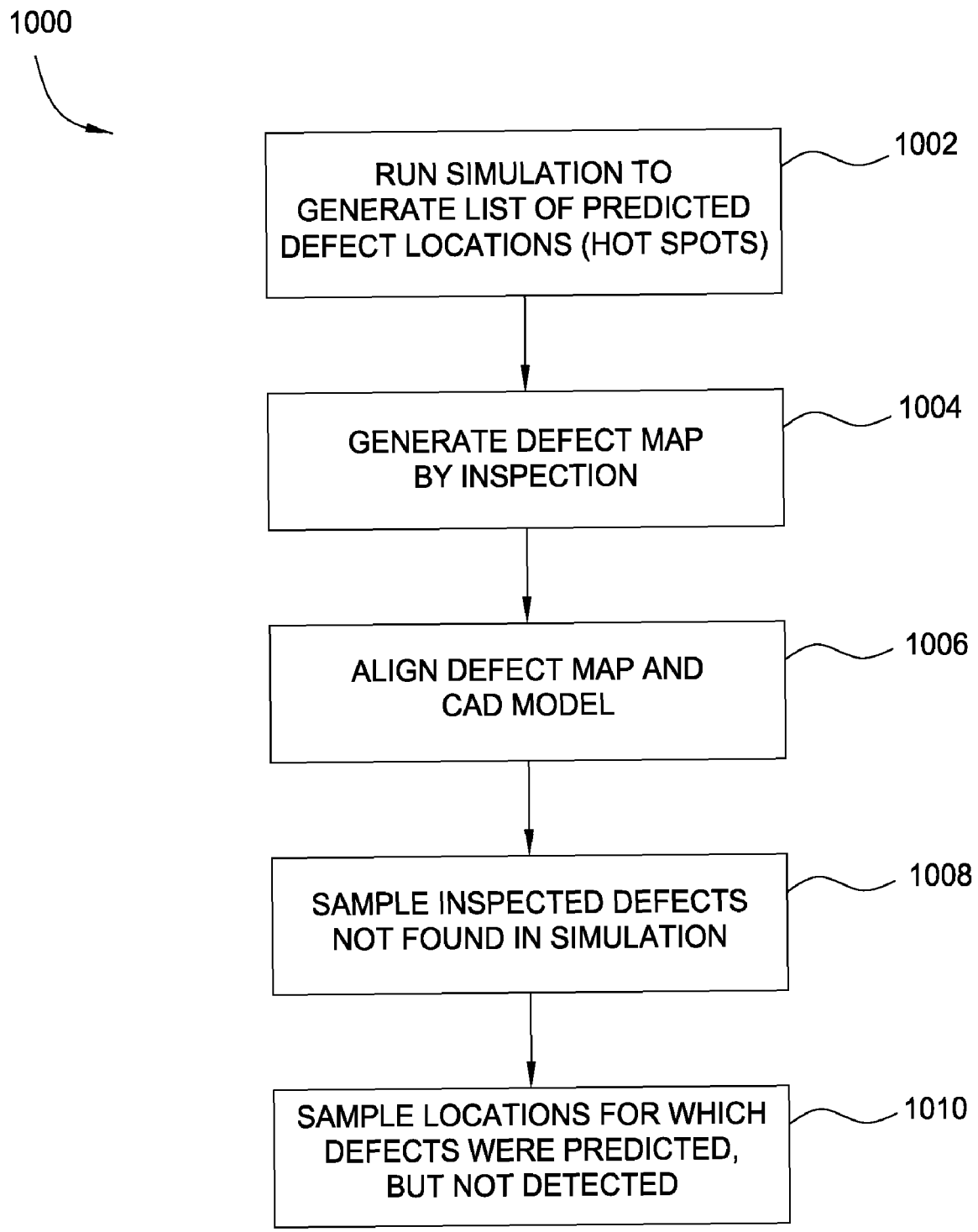
FIG. 10 is a flow diagram of exemplary operations for model-based defect binning in accordance with embodiments of the present invention.

FIG. 10 is a flow diagram of exemplary operations 1000 for this type of "model-based" defect binning in accordance with embodiments of the present invention. The operations 1000 begin, at step 1002, by running a simulation to generate a list of hot spots. At step 1004, a defect map is generated by actual inspection of a wafer. At step 1006, the defect map and CAD model are aligned to correlate the position of actual detected defects to structures in the model. At step 1008, defects that were detected, but not predicted by simulation are selected for sampling. At step 1010, locations for which defects were predicted by simulation, but not detected by inspection, are selected for sampling.

FIG. 11 illustrates a sample set of defect locations detected by the operations 1000 of FIG. 10. The first row shows actual inspected defects 1112 for to different die areas, while the second row shows defects 1114 predicted by simulation. The third row illustrates a first sample set, of locations with defects 116 that were detected, but not predicted. Finally, the fourth row illustrates a second sample set, of locations for which defects were predicted, but not detected. For some embodiments, only one of the sample sets may be generated (e.g., only those that were detected but not predicted). For some embodiments, images of one or both of the selected sample locations may be automatically taken (e.g., via SEM), for example, and an image gallery generated, facilitating the task of further inspecting the anomalies between the predicted and detected defects.

As previously described, for some embodiments, different dice may be printed with different focus and exposure combinations (e.g., creating an FEM wafer). For such embodiments, different software simulations may be performed to predict defect locations for dies printed with different combination of focus and exposure levels. Different sample sets may then be selected according to the techniques described above.

In either case, an indication of the location and/or number of each of the different sample sets may be provided using any of the techniques described above with reference to design based binning (e.g., GUIs, graphs, defect maps, and the like). This approach may provide insight into not only the sensitivity of certain structures to process windows, but also into how well software models take into account different process windows.

For some embodiments, corresponding defect maps similar to those described above with reference to FIG. 7 may be generated. For example, a GUI may be provided that allows a user to quickly display a defect map showing the location on a wafer or die of detected, but not predicted defects, as well as locations for which defects were predicted, but not detected.

For some embodiments, design rule checks (DRCs) may be performed as a source of predicted defects rather than, or in addition to, the model-based (ORC/simulation) technique described above. In either case, additional processing may be performed, for example, to classify (bin) defects according to their type. For example, in the case that DRC is used, defects may be classified by which rule in the DRC is violated (e.g., Rule1, Rule2, etc.). In a similar manner, model-based predicted defects may be classified by what type of model-based rule caused the predicted defect (e.g., minimum line pitch, necking, etc.).

Classifying defects in this manner by their type may facilitate defect analysis, for example, by allowing defects of particular types to be binned and presented in any of the manners discussed above (e.g., graphically by type bin or mapped on a die). In any case, by comparing predicted defects of particular types to the presence or absence of actual defects, insight into proximity effects may be gained. In some cases, this insight may lead to improved simulation models and/or better design rules.

Hierarchical Structural Binning

It is common for design elements to be formed as a set of one or more smaller sub-elements. In other words, the final design (e.g., IC or die) may be considered to be a hierarchical collection of compound design elements and sub-elements. For some embodiments, defects may be classified (binned) in a hierarchical manner, for example, detecting and recording the number of defects appearing in a compound element and its sub-elements. This hierarchical defect binning may provide valuable feedback to designers, for example, indicating whether a defect is inherent to a sub-element or only appears in a more complicated compound element.

Figure 12A:
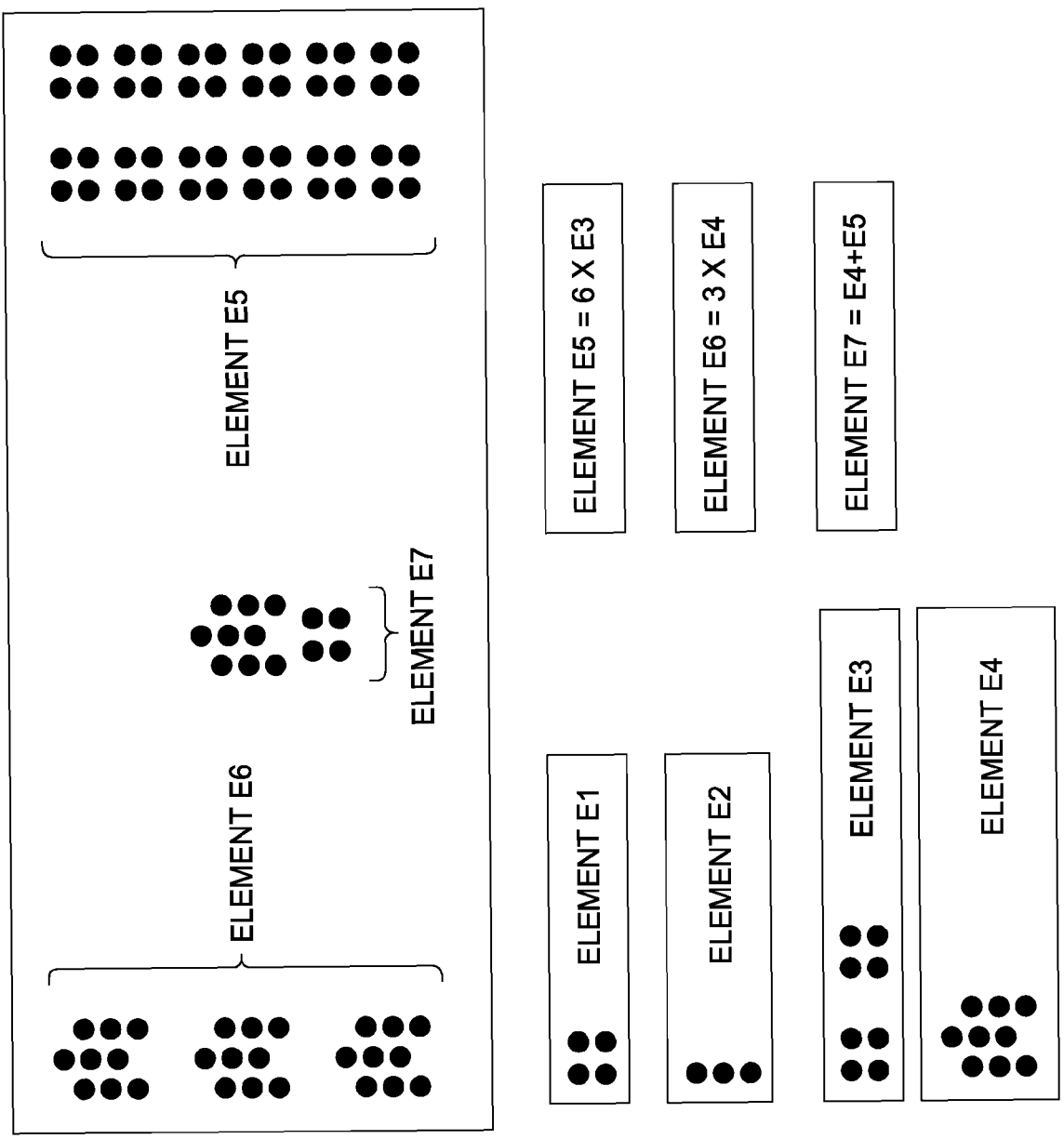

FIGS. 12A and 12B illustrate the concepts of hierarchical defect binning. Referring first to FIG. 12A, three compound design elements E5, E6 and E7 are shown. As illustrate, element E5 is formed by a combination of six sub-elements E3 (which, in turn is formed of two sub-elements E1), element E6 is formed by a combination of three sub-elements E4, while element E7 is formed by a combination of one sub-element E1 and one sub-element E4. As illustrated in FIG. 12B, defect inspection (e.g., utilizing any of the techniques discusses above) may reveal defects at various locations in the elements E5, E6, and E7. Further examination of these defects may be performed to gather insight into the nature of the defects.

For example, as illustrated in FIGS. 13A-13B, for each element, a defect map may be generated that illustrates the location of each defect relative to a sub-structure. Further, for each element, a defect density for each sub-element based on the number of defects and total number of repetitions of the sub-element may also be calculated. As illustrated in FIG. 13A, a map of defect locations for sub-element E4 may be displayed (e.g., via some type of GUI) and a density may be calculated. In this case, the density is 3/3 indicating three defects in three occurrences of the sub-element. In contrast, as illustrated in FIG. 13B, no defects were detected in Element E7, hence a zero defect density for each sub-element E4 and E3.

In some cases, a defect may occur in a sub-element, but not a sub-element from which that sub-element is formed. For example, as illustrated in FIG. 13C, which shows a hierarchical analysis of element E5, sub-element E3 may have a detected defect (resulting in a defect density of 1/6), while sub-element E1 may not have any defects.

Increasing Inspection Signal to Noise

The techniques provided herein may provide for smart sampling of defects captured by an inspection tool. For example, a limited number of a total defect population may be selected for further analysis based on various criteria, such as whether the defects are systematic versus random or based on the impact of the defect (e.g., the impact on process windows to eliminate the defects). Limiting the total number of defects to a more manageable amount in such a manner may provide better prediction of yield and better excursion control.

For some embodiments, defects that are not relevant (e.g., random or "nuisance" defects that occur in non-critical areas and represent a deviation from design intent, but do not result in device failures) may be identified and removed from an overall defect population. Such defects may be identified by comparing them to the results of the electrical test. Nuisance defects would be those defects that do not result in an electrical fault. Killer defects would be those defects that result in electrical faults at least some of the time. Such defects may also be identified by analyzing the total defect population, for example, by applying design based analysis or process models. These defects can be grouped in a "process nuisance" bin and removed from the overall defect population, which may increase the chance of identifying more important random/systematic defects.

For some embodiments, the occurrence of defects that do not map to a common physical location or structure in a die may also be useful. While not indicative of systematic defects, these defects may be classified as random defects, which may also be useful. For example, random defects may be given a lower priority than systematic defects, when deciding on a limited set of defects that warrant further investigation. In addition, further investigation of defects classified as random may lead to greater insight into their cause (which may lead to a re-classification of these defects as systematic).

For some embodiments, feedback from defect analysis performed on previous layers may be used to reduce noise on a current layer. As an example, when analyzing total defect population detected on a given layer, nuisance defects which are systematic by nature (process variations that statistically appear in specific locations in the device), as determined by analyzing previous layers, may be removed from the overall defect population. By applying previous-layer-design-based analysis or process models, in this manner, these defects can be grouped as "process nuisance" bin and remove from the overall defect population, thus increasing the chance of identifying important random/systematic defects.

Figure 14:
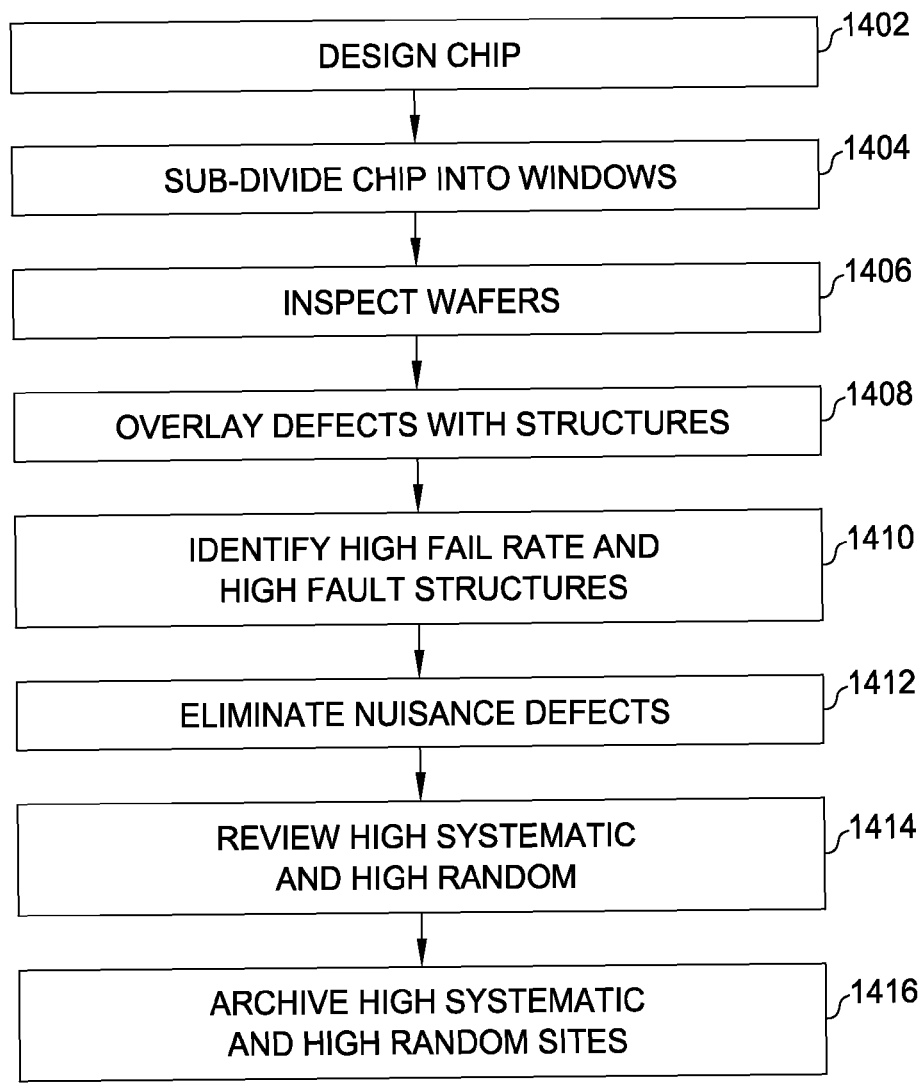
FIG. 14 illustrates an exemplary flow diagram of operations for smart sampling of defects in accordance with embodiments of the present invention.

FIG. 14 illustrates an exemplary flow diagram of operations for smart sampling of defects in accordance with embodiments of the present invention utilizing to remove nuisance binning. The chip is designed, at step 1402, partitioned (e.g., sub-divided into windows or GDS clips) at step 1404, and inspected, at step 1406. Partitioning the chip into windows, may allow for the structural analysis (e.g., design-based binning), overlaying defects with structures, at step 1408, as described above, allowing high fail rate structures to be identified, at step 1410.

Figure 15:
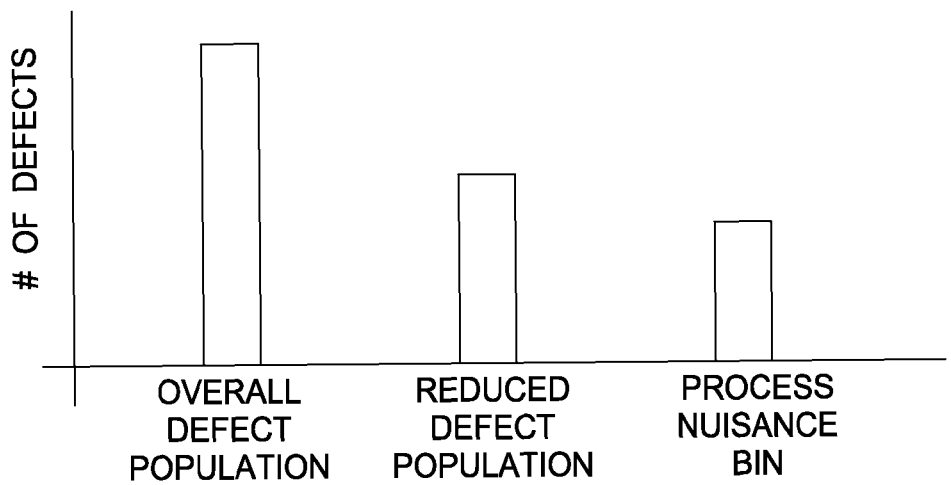
FIG. 15 illustrates how inspection signal to noise ratio may be increased by removing nuisance defects.

At step 1412, nuisance defects are eliminated from the overall defect population. At steps 1414 and 1416, high systematic and/or high random defects are reviewed and archived, respectively. As illustrated in FIG. 15, eliminating nuisance defects from the overall defect population, leading to a much more manageable number of defects to be analyzed. As a result, root causes of defects may be more easily identified.

For some embodiments, the results of defect analysis may be used to control inspection parameters. For example, inspection parameters may be adjusted in an effort to better "focus" on identified defects. As the inspection process is made more sensitive, however, the total number of nuisance defects may rise. Therefore, exactly how the inspection process is adjusted may depend on a particular desired effect and may, in fact, be an iterative process while a balance between an increase in nuisance and actual relevant (killer) defects is achieved.

Figure 16:
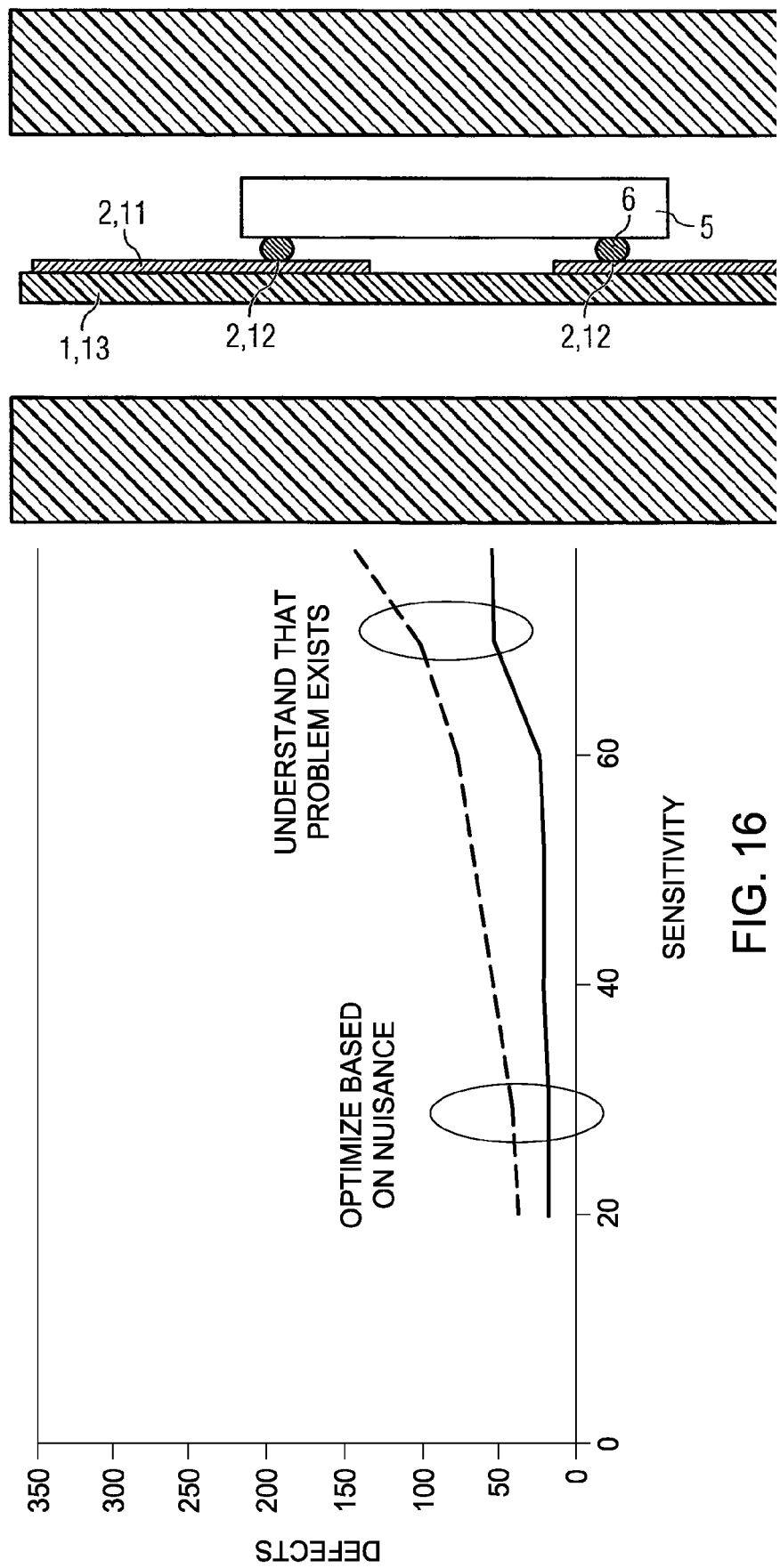
FIG. 16 illustrates the relationship between inspection sensitivity and nuisance defects.

FIG. 16 illustrates this relationship between inspection sensitivity and nuisance defects. As illustrated, the inspection process may be optimized to reduce nuisance defects, by adjusted the settings to a relatively low sensitivity. However, the low sensitivity may result in a number of killer defects not being detected. Thus, the sensitivity may be increased, for example, based on defect analysis described above, in an effort to detect more killer defects, possibly to hone in on defects that were not detected in previous inspections. As illustrated in FIG. 16, a balance may be found with a sensitivity that results in the majority of killer defects being detected, while still limiting the number of nuisance defects detected.

Electrical Inspection Based Binning

As previously described, for some embodiments, software simulation (such as OPC modeling) may be performed to generate a list of failure-potential locations or hot-spots across a die. Inspection techniques, such as optical inspection, or electron beam inspection (EBI) may confirm these predicted defects and/or identify additional defects. However, there may still be a relatively large amount of defects that are not "visible" and are not detected until electrical tests are performed.

For some embodiments of the present invention, optical inspection (and/or EBI) systems may be adjusted based on feedback from electrical inspection, in effect, using the results of electrical inspection to teach the optical systems how to find more electrical defects. Various types of electrical inspection may be utilized, including probe tests, parametric tests and structural tests using scan-chain enabled chips.

Structural tests allow defects within thousands of different net regions that carry a common signal (or simply nets) to be rapidly detected. Nets may be mapped to physical locations on the chip containing the nets, allowing corresponding defects to be isolated to circuit areas involving a limited number of circuit elements (e.g., 10-100 transistors and routing structures, such as vias and conductive lines).

FIG. 17A illustrates circuit elements forming an exemplary net 1710. As illustrated, the net 1710 may be formed by a plurality of conductive lines 1711, connected by vias 1712. Vias 1712 are generally formed as small openings in an insulating oxide layer that allows connection of conductive lines 1711 on different metal layers. While structural tests may indicate the occurrence of a defect 1714 at some point in the net 1710, the precise location of the defect 1714 is not provided.

However, because the structure of the net is known, the net may be logically mapped to an overlay area 1720 of the chip, as shown in FIG. 17B. The overlay area may then be analyzed in an effort to determine a probable defect location. Such analysis may include, for example, determining if there is a critical area within the net structure, determining if there are any suspect circuit features, and determining if there are any identified process sensitivity such as a lithography or a Chemical Mechanical Planarization hot spot.

Further, because the structure associated with the net is known, the same type of binning analysis may be performed by looking at similar nets (e.g., nets with similar structures) with defects to identify common patterns that might indicate a root cause. As an example, such detailed analysis may bring to light that there are common circuit features within nets, such as an isolated via with insufficient enclosure or stacked vias, that may be examined as a potential source of a defect.

Thus, by examining multiple nets, valuable information may be learned about the "signature" a detected electrical defect. In other words, rather than just picking a single electrical defect and inspecting it (e.g., cutting into the die searching for a particle causing a short, the probability of finding an issue in the formation of a circuit feature, such as a stacked via, is increased. Different bins created in this manner may form the basis of hypotheses that can be tested against to help determine defect density or electrical defect density.

Figure 18:
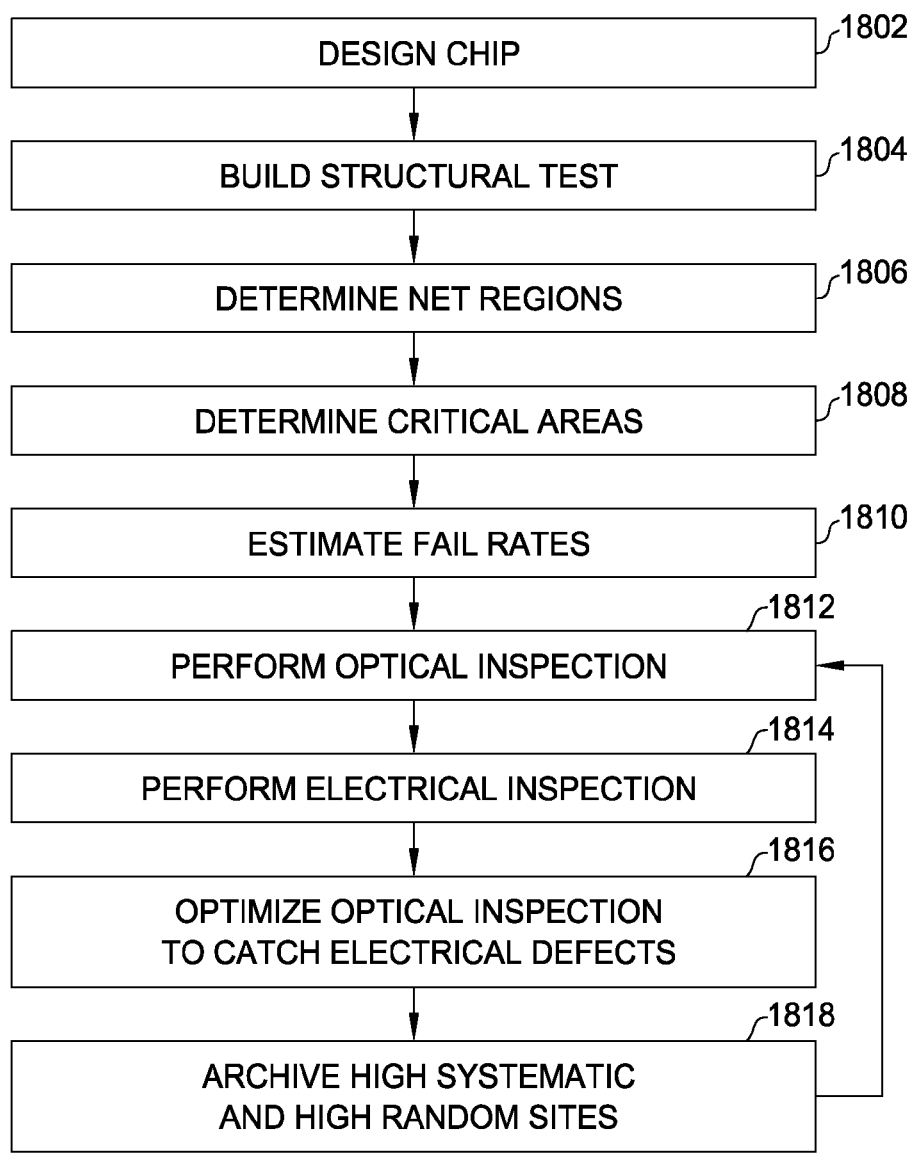
FIG. 18 illustrates an exemplary flow diagram for optimizing optical inspection based on feedback from electrical inspection.

FIG. 18 illustrates an exemplary flow diagram of operations for utilizing the results of electrical inspection to enhance optical inspection, in accordance with embodiments of the present invention. The chip is designed, at step 1802, and a structural test is built, at step 1804. The chip may be scan-chain enabled and the structural test may involve a variety of test vectors to be loaded into the chip for testing. Net regions may be determined, at step 1806, allowing logical mapping to physical locations on the chip. At step 1808, parameters such as critical area and first to fail locations may be determined and fail rates may be estimated, at step 1810.

Optical inspection may be performed, at step 1812, as described above, including analysis and binning. At step 1814, electrical inspection is performed (e.g., utilizing the structural test built at step 1804). Analysis on defects detected by electrical inspection may be performed as described above. In this manner, electrical inspection may be considered as another inspection that detects defects.

As illustrated, for some embodiments, optical inspection may be optimized, at step 1816, for example, in an effort to detect more electrical defects during optical inspection. High systematic and random sites may also be archived, at step 1818, allowing for later analysis and possible feedback to designers.

As an example of optimizing optical inspection, after analyzing the results of electrical defects and identifying common structures or circuit elements occurring in defective nets, optical inspection may be adjusted to identify such common structures as defective. In some cases, adjustments to rules used to identify and classify defects may be adjusted. An example of such adjustment may be to require an increased amount of enclosure of a via if a high number of defects are detected in nets having vias with marginal enclosure. As another example, the minimum spacing between wide metal lines may be increased if a high number of defects are found in corresponding nets.

FIG. 19 illustrates, with exemplary values, a hypothetical relationship between structure attributes and structural test results. In the illustrated example, metal layer 1 (M1) height, minimum poly-Si (poly) pitch, contact poly spacing, and the existence of stacked vias, are shown as attributes listed for corresponding windows and their structural test results. In this example, a large number of defects occurring in a structural area designated as Window 4, have two stacked vias. Again, by extracting information about the signature of an electrical defect by analyzing defects occurring in multiple nets, rather than studying individual electrical defects, the probability of finding some issue with a stacked via may be increased. All the processes involved in forming the stacked vias, or that are affected by the presence of the stacked vias, may be examined for a root cause.

Figure 20B:
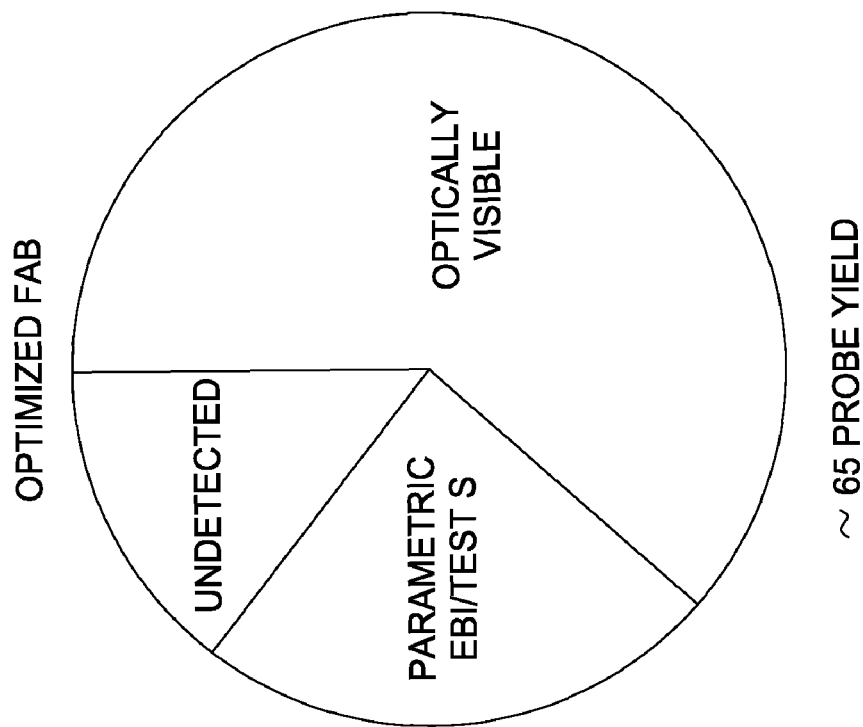
FIGS. 20A and 20B illustrate how the number of defects detected by optical inspection may be increased based on feedback from electrical inspection.

As described above, optical inspections may be optimized (or "re-tuned") to provide detection of electrical defects, by classifying as defective structures with features that are known to correlate with a high rate of electrical defects. In this manner, defects that may have been invisible to optical inspection during a first inspection may be detected in subsequent inspections, as illustrated in FIGS. 20A and 20B, which show pie charts of defects detectable by inspection and undetectable defects (e.g., detectable only by probe tests).

Figure 20A:
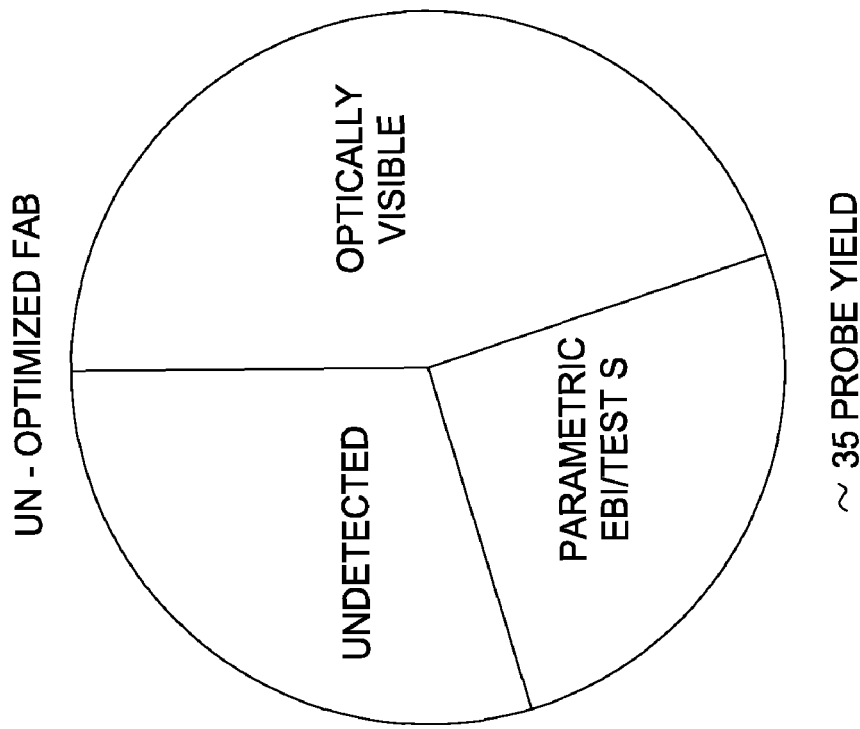

In the example shown in FIG. 20A, approximately 40% of total defects are optically visible (i.e., detected by optical inspection), with approximately 30% detected by electrical inspection (structural or parametric) and another 30% undetected. FIG. 20B, on the other hand, illustrates how optical inspection may be optimized to detect a large percentage of electrical defects previously undetected by optical inspection. As a result of optimizations (e.g., adjusting optical inspection and performing failure analysis on electrical defects), overall defects go down (as illustrated by an approximate 65% probe yield versus an approximate 30% for FIG. 20A). The number of optically visible defects is also increased, and the number of undetected defects reduced.

CONCLUSION

By automatically categorizing defects according to the structure in which they occur, the amount of time required to extract meaningful information regarding design process interaction may be significantly reduced. As a result, root causes may be identified sooner, and design or process recipes changed accordingly, which may result in enhanced production yield.

While the foregoing is directed to embodiments of the present invention, other and further embodiments of the invention may be devised without departing from the basic scope thereof, and the scope thereof is determined by the claims that follow.

What is claimed is:

1. A method for inspecting a semiconductor wafer, comprising:

determining locations of visible defects on the semiconductor wafer via an optical inspection process;

determining locations of electrical defects on the semiconductor wafer via an electrical inspection process;

mapping the electrical defects to physical locations on the semiconductor wafer, allowing corresponding defects to be isolated to corresponding circuit areas involving a limited number of circuit elements;

analyzing the electrical defects to identify potential defects or defect locations associated with the common structures or circuit elements in corresponding circuit areas; and adjusting the optical inspection process based on the identified common structures or circuit elements to identify electrical defects previously undetected by the optical inspection process.

2. The method of claim 1, wherein determining locations of electrical defects on the semiconductor wafer via a second inspection process involving electrical tests comprises:
performing structural tests involving scan-chains to identify defective net structures; and
mapping defective net structures to physical locations on the wafer.

3. The method of claim 1, wherein adjusting the optical inspection process based on the identified common structures or circuit elements comprises adjusting or creating a rule to identify and classify the identified common structures or circuit elements during the first optical inspection process.

4. The method of claim 1, further comprising:
prioritizing defects detected in the optical inspection process for additional investigative operations using the identified common structures or circuit elements.

5. The method of claim 4, wherein the additional investigative operations involve at least one of: inspection using a scanning electron microscope, cross-sectional analysis of the defect, and elemental analysis of the defect.

6. A computer-readable medium containing instructions which, when executed by a processor, perform operations for inspecting a semiconductor wafer, the operations comprising:
determining locations of visible defects on the semiconductor wafer via an optical inspection process;
determining locations of electrical defects on the semiconductor wafer via an electrical inspection process;
mapping the electrical defects to physical locations on the semiconductor wafer, allowing corresponding defects to be isolated to corresponding circuit areas involving a limited number of circuit elements;
analyzing the electrical defects to identify potential defects or defect locations associated with the common structures or circuit elements in corresponding circuit areas; and
adjusting the optical inspection process based on the identified common structures or circuit elements to identify electrical defects previously undetected by the optical inspection process.

7. A method for inspecting a semiconductor wafer, comprising:
determining visible defects on the semiconductor wafer by performing an optical inspection process;
identifying electrical defects by performing electrical tests on the semiconductor wafer;
mapping the electrical defects to physical locations on the semiconductor wafer, allowing corresponding defects to be isolated to corresponding circuit areas involving a limited number of circuit elements;
analyzing the physical locations to which one or more multiple defects are mapped to classify the multiple defects as random or systematic; and
adjusting the optical inspection process based on the analysis to identify electrical defects previously undetected by the optical inspection process.

8. The method of claim 7, wherein analyzing the physical locations to which one or more multiple defects are mapped to identify the multiple defects as random or systematic comprises:
classifying multiple defects mapped to common physical locations as systematic.

9. The method of claim 8, wherein analyzing the physical locations to which one or more multiple defects are mapped to identify the multiple defects as random or systematic comprises:
classifying a defect that is not mapped to common physical locations as random.

10. The method of claim 9, further comprising:
prioritizing defects detected in the optical inspection process for additional investigative operations, wherein defects classified as random are given a different priority than defects classified as systematic.

* * * * *

UNITED STATES PATENT AND TRADEMARK OFFICE
CERTIFICATE OF CORRECTION

PATENT NO. : 7,760,929 B2
APPLICATION NO. : 11/553745
DATED : July 20, 2010
INVENTOR(S) : Orbon et al.

It is certified that error appears in the above-identified patent and that said Letters Patent is hereby corrected as shown below:

In the Detailed Description:

Column 7, Line 2, please delete "$400_1$ and $400_2$" and insert --$410_1$ and $410_2$-- therefor;

Column 10, Line 1, please delete "GUIs" and insert --GUIs-- therefor;

In the Claims:

Column 15, Claim 3, Line 16, please delete "first".

Signed and Sealed this

Ninth Day of November, 2010

David J. Kappos
*Director of the United States Patent and Trademark Office*